United States Patent [19]

Hirosawa

[11] Patent Number: 5,578,341
[45] Date of Patent: Nov. 26, 1996

[54] METHOD OF MANUFACTURING PRINTED CIRCUIT BOARD BY A BUILD-UP TECHNIQUE

[75] Inventor: Kouichi Hirosawa, Tokyo, Japan

[73] Assignee: NEC Corporation, Tokyo, Japan

[21] Appl. No.: 364,452

[22] Filed: Dec. 27, 1994

[30] Foreign Application Priority Data

Dec. 28, 1993 [JP] Japan ................... 5-337159

[51] Int. Cl.⁶ ..................................... B05D 5/12
[52] U.S. Cl. ............................... 427/97; 427/98
[58] Field of Search .................... 427/96, 97, 98

[56] References Cited

U.S. PATENT DOCUMENTS

| | | | |
|---|---|---|---|
| 4,512,818 | 4/1985 | Valayil et al. | 148/6.14 R |
| 5,076,864 | 12/1991 | Tanaka et al. | 148/269 |
| 5,106,454 | 4/1992 | Allardyce et al. | 156/629 |
| 5,252,355 | 10/1993 | Ando et al. | 427/98 |
| 5,382,333 | 1/1995 | Ando et al. | 204/130 |

FOREIGN PATENT DOCUMENTS

| | | |
|---|---|---|
| 3298 | 1/1991 | Japan . |
| 3-3297 | 1/1991 | Japan . |

*Primary Examiner*—Shrive Beck
*Assistant Examiner*—Brian K. Talbot
*Attorney, Agent, or Firm*—Young & Thompson

[57] ABSTRACT

A method of manufacturing a printed wiring board by a build-up technique improves the bonding force between a conductor circuit and a resin. After the surface of the first conductor pattern is roughened by oxidation, an insulating layer is formed to expose a viahole portion of the first conductor pattern. Then the resin insulating layer is roughened and the board is reduction processed before a plating operation is carried out.

4 Claims, 3 Drawing Sheets

METHOD OF MANUFACTURING PRINTED CIRCUIT BOARD BY A BUILD-UP TECHNIQUE

BACKGROUND OF THE INVENTION

1. Field of the Invention

The present invention relates to a method of manufacturing a printed circuit board (referred to as PCB hereinafter), and more particularly to a method of manufacturing a PCB in which a viahole is formed by employing a so-called build-up technique for successively forming inner layer circuits and insulating layers.

2. Description of the Prior Art

According to the method disclosed in Japanese Laid-Open Patent Publ. No. 3-3298, after forming a first copper conductor pattern 1 on a board 2 (FIG. 1A), the surface 3 of the conductor pattern 1 is subjected to a roughening process (FIG. 1B) to increase the adhesive force between the conductor pattern 1 and a resin film 5 to be coated on the conductor pattern 1 as shown in FIG. 1C.

Then, the surface 6 of the resin insulating layer 5 is roughened to improve the bonding force with a plated layer 7 to be formed thereon and an exposed surface of the first conductor pattern 1 is made flat by a soft etching process as shown in FIG. 1D to improve an electrical connection with the second conductor pattern 7 which is formed by platings as shown in FIG. 1E such that a viahole 8 is formed on the exposed flat surface of the first conductor pattern 1.

In the roughening process for the first copper conductor pattern 1, black needle crystals of copper oxide are grown chemically to enlarge the surface area of the copper conductor pattern and improve its bonding force by the anchor effect due to pores formed on the surface of the conductor pattern 1. But such a roughening process generates a so-called pink ring or halo caused by the dissolution of copper oxide into an acidic solution used in the plating process of the second conductor pattern 7. The formation of the pink ring at the periphery of the viahole causes peeling of the resin insulating layer at the periphery of the viahole due to corrosion of copper oxide present on the adhesion surface of the resin insulating layer and the conductor pattern 1. To prevent the undesired pink ring phenomenon, the prior art recommends to subject the roughened surface of the first copper layer to a reduction process prior to forming the resin insulating layer 5.

However, such a reduction process likewise reduces the above-mentioned anchor effect.

Moreover, since the roughening process for the resin insulating layer uses a powerful oxidizing agent, the first conductor pattern which was already treated by the reduction process tends to be oxidized again and thus the recommended reduction process cannot effectively prevent the pink ring phenomenon.

SUMMARY OF THE INVENTION

It is therefore an object of this invention to provide a method of manufacturing a PCB by employing a build-up technique in which the bonding force between the first conductor circuit and resin is improved while preventing the pink ring phenomenon.

According to the invention, a reduction process is applied to an exposed portion of the first conductor pattern only after forming an insulating layer. Preferably, a step of roughening the insulating layer is carried out after the reduction process.

According to this invention, the following benefits can be realized.

(1) For circuits or the like which are not connected to the upper layer by a viahole (in contrast to the situation for the first and the second layers), a roughening processing such as oxidation may be applied in order to improve their bonding force.

(2) In the portion to become the viahole, including the contact part with resin, cupric oxide is reduced to cuprous oxide, or even to metallic copper, so that the generation of a pink ring during plating, and the accompanying separation of the conductor patterns, can be prevented.

(3) An additional flattening process is not required in accomplishing the foregoing items (1) and (2).

(4) The PCB is hardly affected by any other oxidation processing which may be given when required.

BRIEF DESCRIPTION OF THE DRAWINGS

The above and other objects, features and advantages of this invention will become more apparent by reference to the following detailed description of the invention taken in conjunction with the accompanying drawings, wherein.

DESCRIPTION OF THE PREFERRED EMBODIMENTS

Referring to FIG. 2A to FIG. 2H, the first embodiment of the invention will be described for the case of a PCB comprising two layers of conductor patterns.

Figure 1A:
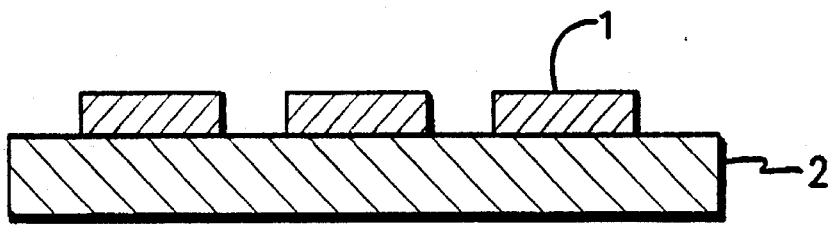
FIG. 1A shows a partial sectional view of the first stage of manufacture of a build-up PCB according to the prior art.
Figure 1B:
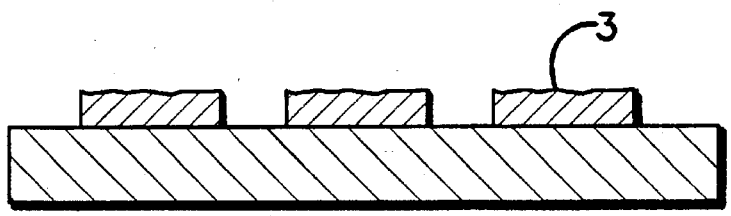
FIG. 1B shows a partial sectional view of the second stage of manufacture of a built-up PCB according to the prior art.
Figure 1C:
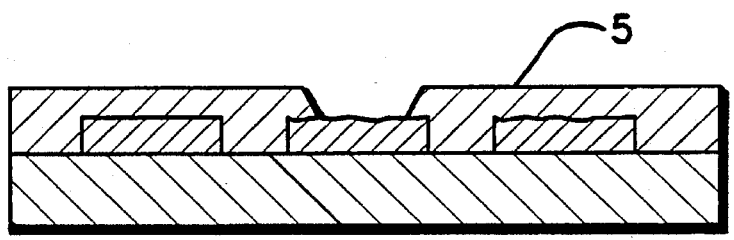
FIG. 1C shows a partial sectional view of the third stage of manufacture of a built-up PCB according to the prior art.
Figure 1D:
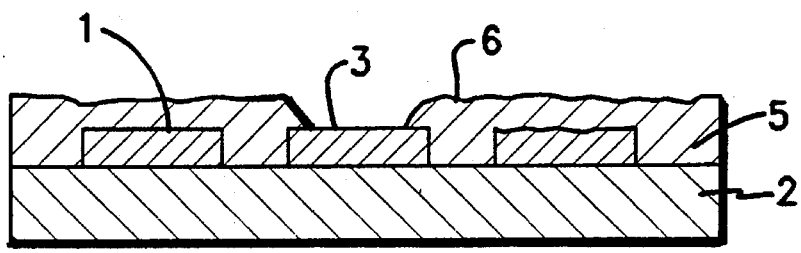
FIG. 1D shows a partial sectional view of the fourth stage of manufacture of a built-up PCB according to the prior art.
Figure 1E:
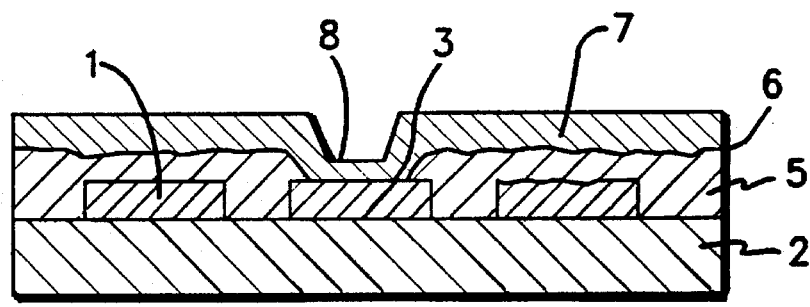
FIG. 1E shows a partial sectional view of the fifth stage of manufacture of a built-up PCB according to the prior art.
Figure 2A:
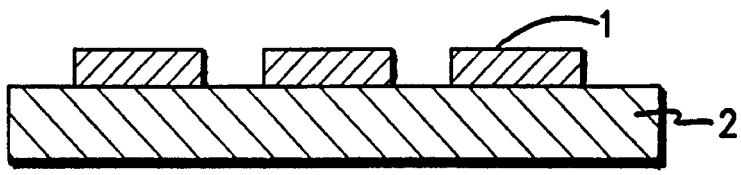
FIG. 2A shows a partial sectional view of an embodiment of the invention at the first stage of manufacture.

A mask pattern is formed using a dry film (for example "LISTON"® made by DuPont) on one surface of a 1.6 mm-thick glass epoxy base material having a cladding of 12 μm-thick copper foil, and a board 2 having a conductor pattern (first layer) 1 is formed by etching the base material using cupric chloride as the etchant (FIG. 2A).

Next, the board 2 is subjected to an oxidizing process or blackening process according to the following method. (Needless to say, the blackening process according to any other suitable method may also be used.)

TABLE

Treatment Steps for Blackening Process

| Step | Treatment | Temperature (°C.) | Time (min.) |
| --- | --- | --- | --- |
| 1 | Cleaning | Alkaline cleaner | 60–70 | 4–6 |
| 2 | Warm water washing | Warm water | 40–50 | 1–3 |
| 3 | Water washing | Cold water | Room temperature | 6 |
| 4 | Microetching | Mixed aqueous solution of hydrogen peroxide solution and sulfuric acid | 35 | 1–2 |
| 5 | Water washing | Cold water | Room temperature | 1–2 |
| 6 | Diluted sulfuric acid washing | 10% aqueous solution of sulfuric acid | Room temperature | 1–2 |
| 7 | Water washing | | Room temperature | 1–2 |
| 8 | Oxidation treatment | Mixed aqueous solution of hypochlorous acid and sodium hydroxide | 70 | 5 |
| 9 | Water washing | Water | Room temperature | 5 |
| 10 | Drying | Hot air | 80–90 | 8–10 |

Figure 2B:
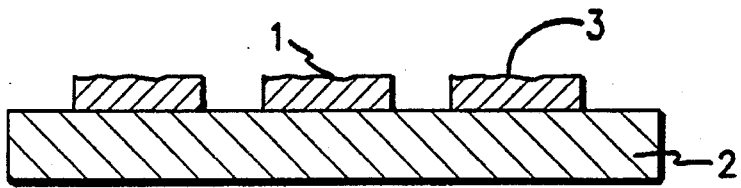
FIG. 2B shows a partial sectional view of an embodiment of the invention at the second stage of manufacture.

The bonding force of the conductor pattern 1 is improved by the formation of black fine needle crystals 3 of copper oxide by the blackening process. Although the effect of the blackening depends on the processing conditions, in general the usual bonding force of less than 0.5 kg/cm² for the case of no blackening is improved to more than 1.0 kg/cm² by the blackening (FIG. 2B).

Figure 2C:
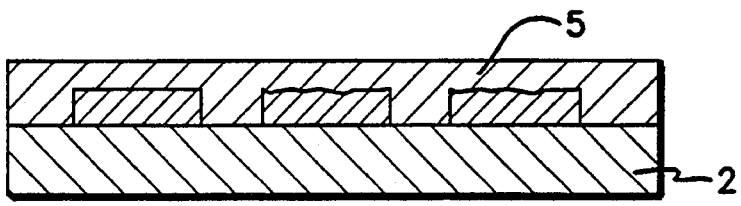
FIG. 2C shows a partial sectional view of an embodiment of the invention at the third stage of manufacture.
Figure 2D:
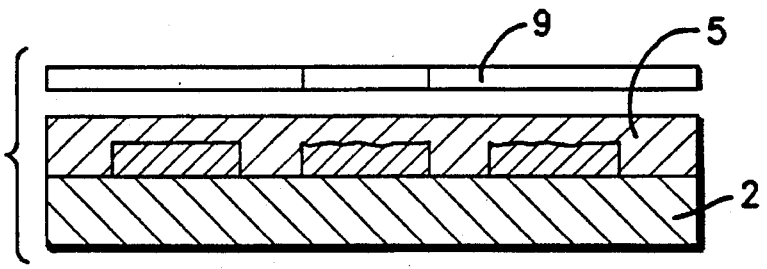
FIG. 2D shows a partial sectional view of an embodiment of the invention at the fourth stage of manufacture.

Next, the board 2 is coated with a photosensitive resin (for example, "PROVIR"® #52 made by Ciba-Geigy) which as an epoxy resin as the principal component to a thickness of 50 μm on the base material, and the resin 5 is partially dried (FIG. 2C). Following that, a desired pattern is formed on the photosensitive resin film 5 by carrying out an exposure of about 3000 mJ using a mask 9 (FIG. 2D).

Figure 2E:
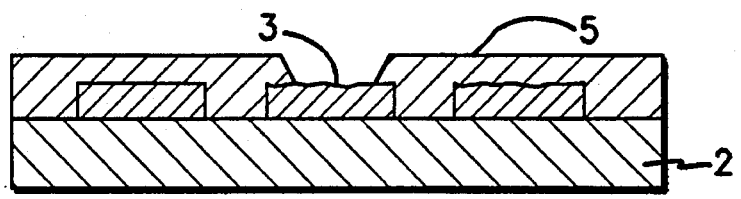
FIG. 2E shows a partial sectional view of an embodiment of the invention at the fifth stage of manufacture.

The patterned board 2 is developed using a developer (mixture of microhexanone, methyl "Cellosolve" and gamma-butyrolactone), for example, "DY-90" also made by Ciba-Geigy, with a wetting time of 1 to 5 mins, to form a hole (with diameter of about 200 μm) to act as a viahole for connecting the first and the second conductor patterns. At that time, the blackened surface 3 is exposed in the area that will underlie the viahole (FIG. 2E).

Figure 2F:
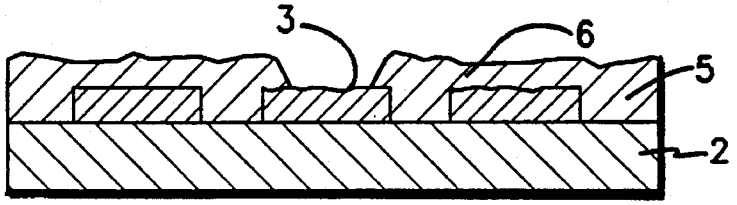
FIG. 2F shows a partial sectional view of an embodiment of the invention at the sixth stage of manufacture.

Next, the resin insulating layer is subjected to an insulating layer roughening using one-to-one aqueous solution of 1N chromic acid and 1N sulfuric acid. As a result of this processing, there appears a roughened surface 6 of the resin insulating layer 5 having fine roughness and porosity (FIG. 2F).

In this process the exposed blackened surface is also subjected to oxidation, but it does not cause any problems since it is a blackened surface of copper oxide to begin with.

Figure 2G:
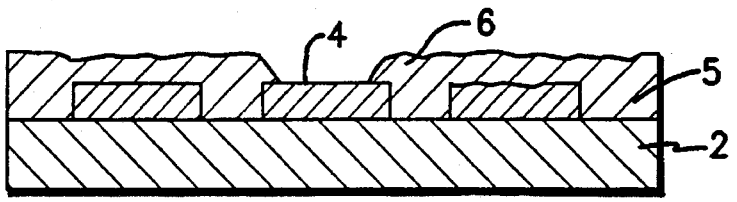
FIG. 2G shows a partial sectional view of an embodiment of the invention at the seventh stage of manufacture.

Next, the exposed blackened surface is reduction processes by dipping the board 2 into a 10 wt. % aqueous solution of dimethylamine borane. At that time, other circuits or the like which are already covered with the resin film will not be reduced by this step; only the exposed part, namely, the part which will underlie the bottom of the viahole 8 is subjected to the reduction process. A blackened surface 4 in which only the intended area is reduced, is produced in this processing (FIG. 2G).

Figure 2H:
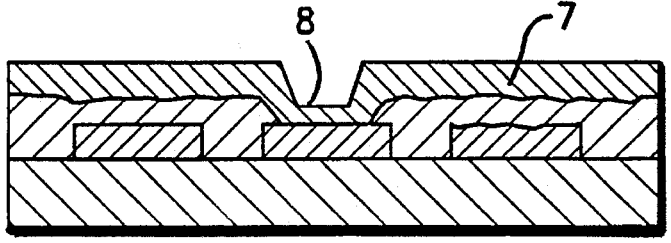
FIG. 2H shows a partial sectional view of an embodiment of the invention at the eighth stage of manufacture.

The board 2 is next subjected to a chemical copper plating which involves reduction with formalin using EDTA as a complexing agent, and an electrolytic copper plating using copper sulfate as the principal component, to form a conductor pattern (second layer) 7 and to define the viahole 8. Since the reduction processing is done in the previous steps to the parts which are to be brought into contact with the plating, there will be no generation of pink ring, and no separation of these parts from one another even if these parts are attacked by hydrochloric acid or the like (FIG. 2H).

If the solution used for the roughening of the resin insulating layer does not too greatly affect copper and cuprous oxide, the reduction processing may be performed prior to the roughening of the resin insulating layer.

FIGS. 3A to 3H are partial sectional views showing a second embodiment of the invention. It will be appreciated that the method can likewise be applied to a plurality of layers that are already formed by another suitable method. Since the steps shown in FIGS. 3A to 3E are the same steps shown in FIGS. 2A to 2E, a description of those steps will not be repeated.

Figure 3A:
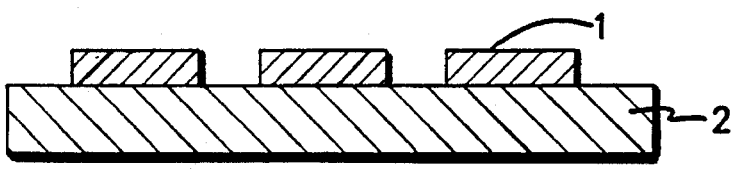
FIG. 3A shows a partial sectional view of another embodiment of the present invention at the first stage of manufacture.
Figure 3B:
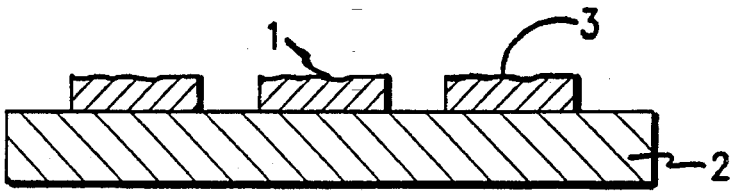
FIG. 3B shows a partial sectional view of another embodiment of the present invention at the second stage of manufacture.
Figure 3C:
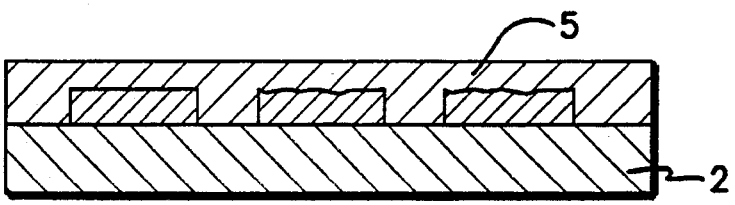
FIG. 3C shows a partial sectional view of another embodiment of the present invention at the third stage of manufacture.
Figure 3D:
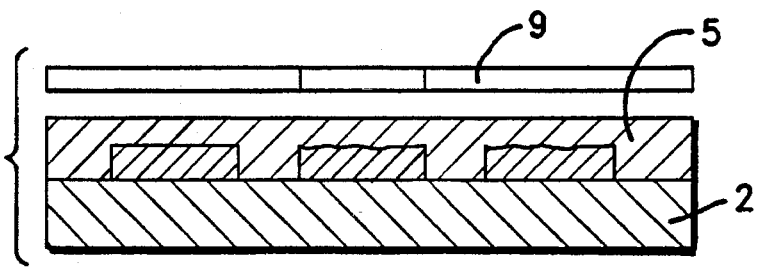
FIG. 3D shows a partial sectional view of another embodiment of the present invention at the fourth stage of manufacture.
Figure 3E:
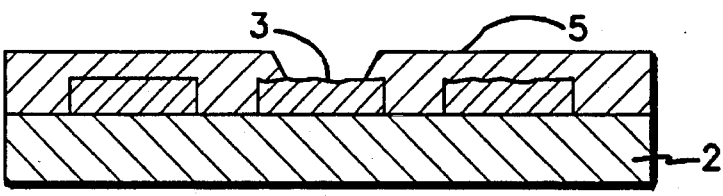
FIG. 3E shows a partial sectional view of another embodiment of the present invention at the fifth stage of manufacture.
Figure 3F:
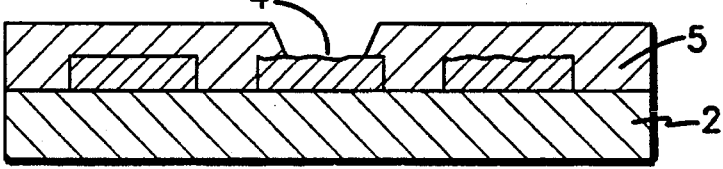
FIG. 3F shows a partial sectional view of another embodiment of the present invention at the sixth stage of manufacture.

After the blackened surface 3 is exposed at the position planned for the viahole as shown in FIG. 3E, the exposed blackened surface is subjected to a reduction processing by dipping the board 2 into a 10 wt. % aqueous solution of dimethylamine borane. At that time, other circuits or the like are already covered with resin, so that they are not reduced by this step. Only the exposed part, namely, the part which is to underlie the viahole is reduced, and a reduced blackened surface 4 is formed (FIG. 3F).

Figure 3G:
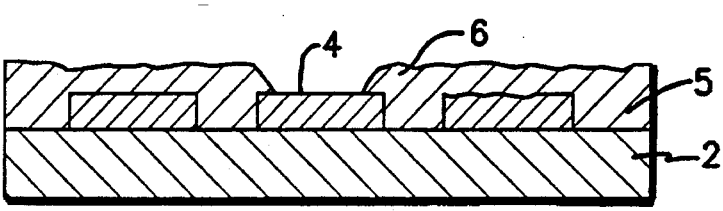
FIG. 3G shows a partial sectional view of another embodiment of the present invention at the seventh stage of manufacture.

Next, the resin insulating layer 5 is roughened using a one-to-one mixed aqueous solution of 2N potassium permanganate and 2N sodium hydroxide. As a result of this processing, the resin insulating layer 5 is roughened, and there appears a roughened surface 6 of the resin insulating layer having fine and durable porosity (FIG. 3G).

Figure 3H:
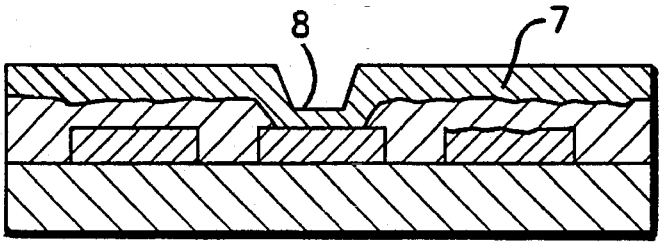
FIG. 3H shows a partial sectional view of another embodiment of the present invention at the eighth stage of manufacture.

A conductor pattern (second layer) 7 defining a viahole 8 is formed by subjecting the board 2 to a chemical copper plating in which reduction by formalin using EDTA as the complexing agent is performed, with an electrolytic copper plating having copper sulfate as the principal component. No pink ring, nor any separation of layers occurs, since the parts to be brought into contact with the plating are subjected to the reduction processing in the previous step (FIG. 3H).

As described above, since the reduction is carried out for exposed portions of the circuits after forming a resin insulating layer, the present invention provides the following benefits.

(1) It is possible to prevent the generation of a pink ring which tends to be formed in the periphery of the photo viahole without deteriorating the bonding strength between the resin and the conductor pattern.

(2) At the same time, the reliability of the photo viahole itself will not be spoiled.

(3) No special mask or the like is required in accomplishing items (1) and (2).

(4) The process is simple and no additional manpower is called for.

Although the invention has been described with reference to special embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

I claim:

1. A method of manufacturing a printed circuit board comprising the steps of:

forming a circuit layer on a board;

roughening a surface of said circuit layer;

forming an insulating layer on said circuit layer having an opening exposing a viahole area of the first circuit layer;

roughening a surface of said insulating layer;

subjecting only said exposed viahole area of said circuit layer to a reduction process after said roughening of the surface of said insulating layer; and applying an additional plating to said printed circuit board following said reduction processing without using a soft etching process prior to applying said additional plating.

2. A method of manufacturing a printed circuit board according to claim 1, wherein said roughening of the surface of the first circuit layer is an oxidizing process using potassium persulfate and sodium hydroxide.

3. A method of manufacturing a printed circuit board according to claim 1, wherein said roughening of the surface of the first circuit layer is an oxidizing process using sodium hypochlorite and sodium hydroxide.

4. A method of manufacturing a printed circuit board comprising the steps of:

forming a circuit layer on a board;

roughening a surface of said circuit layer to provide an anchor effect;

forming an insulating layer on said circuit layer without reducing said anchor effect;

providing an opening in said insulating layer to expose a selected region of said circuit layer;

roughening a surface of said insulating layer;

subjecting only said selected region of said circuit layer exposed from said opening to a reduction process after said roughening of the surface of said insulating layer; and applying an additional plating on said insulating layer and said selected region exposed from said opening after said reduction process.

* * * * *